United States Patent [19]

Sivaramakrishnan

[11] Patent Number: 5,872,065
[45] Date of Patent: Feb. 16, 1999

[54] METHOD FOR DEPOSITING LOW K SI-O-F FILMS USING SIF$_4$/OXYGEN CHEMISTRY

[75] Inventor: Visweswaren Sivaramakrishnan, Santa Clara, Calif.

[73] Assignee: Applied Materials Inc., Santa Clara, Calif.

[21] Appl. No.: 825,880

[22] Filed: Apr. 2, 1997

[51] Int. Cl.$^6$ .................................................. H01L 21/316
[52] U.S. Cl. ..................... 438/784; 438/788; 427/563; 427/568; 427/579
[58] Field of Search ............................... 438/784, 788, 438/902, 624, 763; 427/563, 568, 579; 148/DIG. 118

[56] References Cited

U.S. PATENT DOCUMENTS

| | | | |
|---|---|---|---|
| 4,300,989 | 11/1981 | Chang | 204/164 |
| 4,717,586 | 1/1988 | Ishihara et al. | 427/39 |
| 4,818,563 | 4/1989 | Ishihara et al. | 427/55 |
| 4,894,352 | 1/1990 | Lane et al. | 438/238 |
| 5,013,691 | 5/1991 | Lory et al. | 437/237 |
| 5,156,881 | 10/1992 | Okano et al. | 428/572 |
| 5,215,787 | 6/1993 | Homma | 427/248.1 |
| 5,244,698 | 9/1993 | Ishihara et al. | 427/563 |
| 5,275,977 | 1/1994 | Otsubo et al. | 437/235 |
| 5,288,518 | 2/1994 | Homma | 427/255.1 |
| 5,334,552 | 8/1994 | Homma | 437/195 |
| 5,385,763 | 1/1995 | Okano et al. | 427/572 |
| 5,399,529 | 3/1995 | Homma | 437/195 |
| 5,403,630 | 4/1995 | Matsui et al. | 427/583 |
| 5,407,529 | 4/1995 | Homma | 156/643 |
| 5,413,967 | 5/1995 | Matsuda et al. | 437/235 |
| 5,420,075 | 5/1995 | Homma et al. | 437/195 |
| 5,429,995 | 7/1995 | Nishiyama et al. | 437/238 |
| 5,753,564 | 5/1998 | Fukada | 437/238 |

FOREIGN PATENT DOCUMENTS

| | | | |
|---|---|---|---|
| 61-276977 | 12/1986 | Japan | C23C 16/50 |
| 4-239750 | 8/1992 | Japan | H01L 21/90 |
| 4-341568 | 11/1992 | Japan | C23C 16/40 |
| 08078408 | 3/1996 | Japan . | |
| WO 92/20833 | 5/1991 | WIPO | C23C 16/00 |

OTHER PUBLICATIONS

U.S. application No. 08/538696, Verna et al., filed Oct. 2, 1995.

S. Takeisha, et al., "Stabilizing Dielectric Constants Fluorine–Doped–SiO$_2$ Films by N2O–plasma Annealing," (1995), DUMIC Conference, pp. 257–259.

D. Carl, et al., "The Effect of O$_2$:C$_2$F$_6$ Ratios and Low Frequency Power on the Gap Fill Properties and Stability of F–TEOS Films," (1995), DUMIC Conference, pp. 234–240, *abstract*.

N.Hayasaka, et al., "High–Quality and Low Dielectric Constant SiO$_2$ CVD Using High Density Plasma," (1993), *Dry Processing Symposium*, pp. 163–168.

K. Musaka, et al., "Single Step Gap Filling Technology for Subhalf Micron Metal Spacings on Plasma Enhanced TEOS/O$_2$ Chemcial Vapor Deposition System," (1993), Conference on Solid State Devices and Materials, pp. 510–512.

(List continued on next page.)

Primary Examiner—Charles L. Bowers, Jr.
Assistant Examiner—Matthew Whipple
Attorney, Agent, or Firm—Townsend and Townsend and Crew

[57] ABSTRACT

An Si—O—F insulating film having a low dielectric constant is deposited on a substrate by thermally reacting disassociated SiF$_4$ radicals and ozone or oxygen gas in a vacuum chamber. The SiF$_4$ radicals are formed remotely from the chamber and interact thermally with the ozone or oxygen without requiring plasma enhancement. The deposited Si—O—F film has good gap-filling properties and is suitable for forming IMD layers over high aspect ratio 0.25 micron geometries.

11 Claims, 11 Drawing Sheets

OTHER PUBLICATIONS

D. Yu, et al., "Step Coverage Study of Peteos Deposition for Intermetal Dielectic Applications," (1990), 1990 VMIC Conference, pp. 166–172.

A. M, Hoff and J. Ruzyllo, "Thermal Oxidation of Silicon in an Afterglow Gas," (undated), Ctr. of Elect. Materials and Devices, Penn. State.

T. Fukada and T. Akahori, "Preparation of SiOF Films Low Dielectric Constant by ECR Plasma CVD," (1995), DUMIC Conference, pp. 43–49.

L. Q. Qian, et al., "High Density Plasma Deposition and Deep Submicron Gap Fill with Low Dielectric Constant SiOF Films," (1995), DUMIC Conference, pp. 50–56.

T. Matsuda, et al., "Dual Frequency Plasma CVD Fluorosilicate Glass Deposition for 0.25 $\mu$m Interlevel Dielectrics," (1995), DUMIC Conference, pp. 22–28.

R. K. Laxman, "Low $\epsilon$ Dielectrics: CVD Fluorinated Silicon Dioxides," (1995), *Semiconductor International,* pp. 71–74.

D. A. Webb, "Silicon Dioxide Films Produced by PECVD of TEOS and TMCTS," (1989), ULSI Science and Technology—Symposium on Ultra Large Scale Integration Science Technology, pp. 571–585.

M. J. Shapiro, et al., "Dual Frequency Plasma CVD Fluorosilicate Glass Water Absorption and Stability ," (1995), DUMIC Conference, pp. 118–123.

D. Yu, et al., "Step Coverage Study of Peteos Deposition for Intermetal Dielectric Applications," (1990), IEEE VLSI Multilevel Interconnection Conference, pp. 165–172.

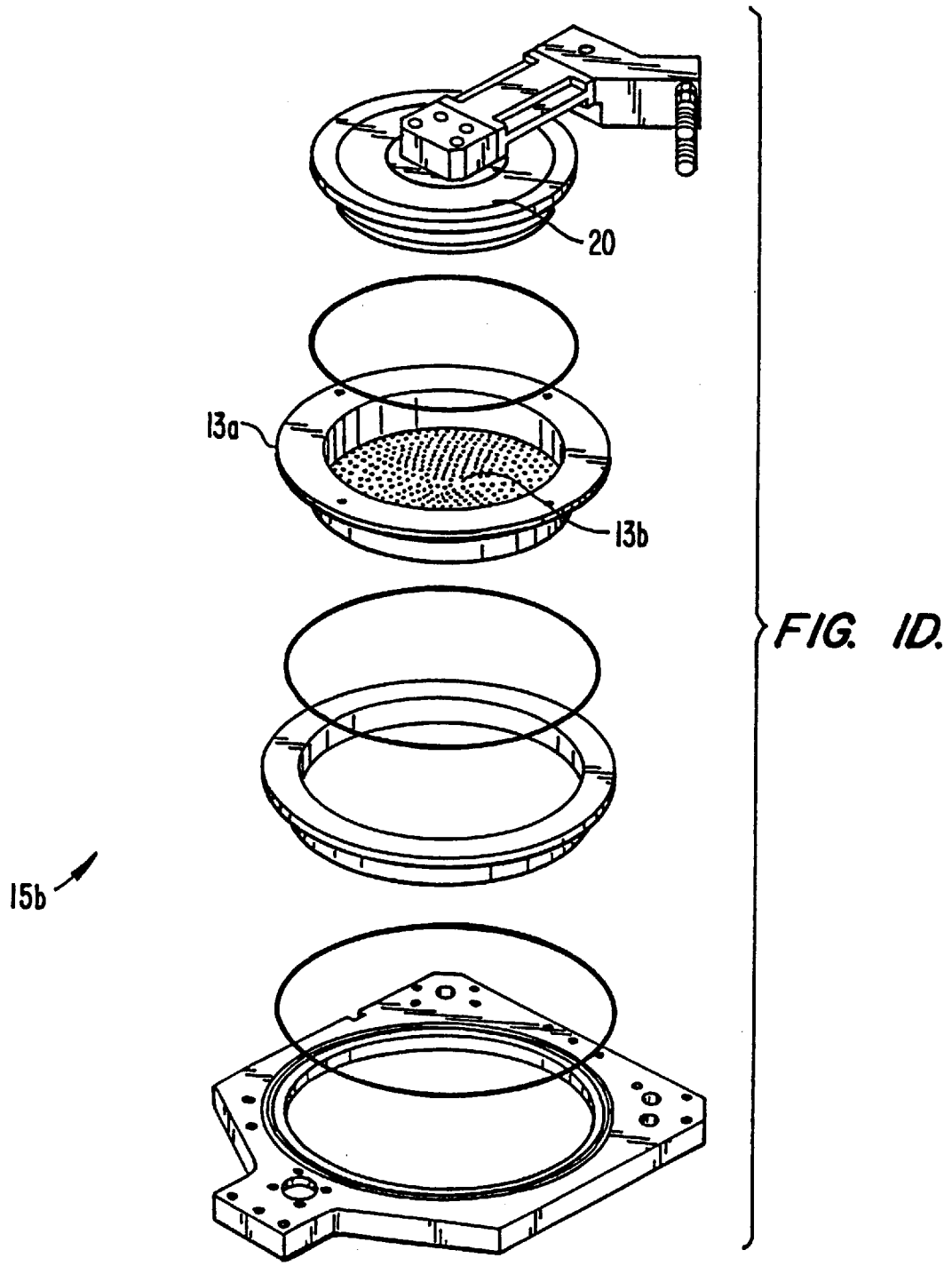

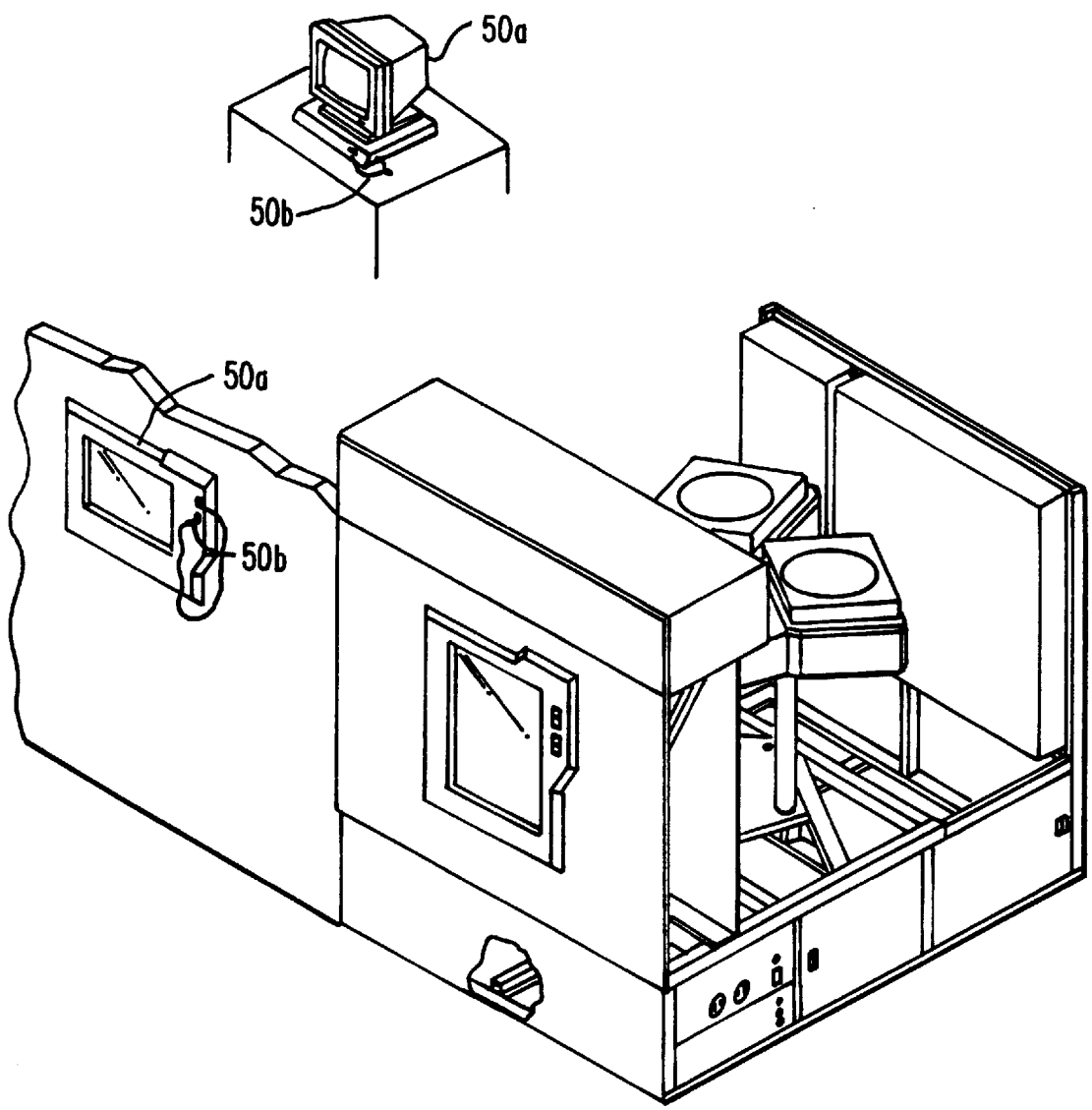
FIG. IE.

METHOD FOR DEPOSITING LOW K SI-O-F FILMS USING SIF₄/OXYGEN CHEMISTRY

BACKGROUND OF THE INVENTION

The present invention relates to the deposition of dielectric layers during wafer processing and more specifically to a method and apparatus for forming a fluorine doped layer having a low dielectric constant and good gap-filling capability.

One of the primary steps in the fabrication of modern semiconductor devices is the formation of a thin film on a semiconductor substrate by chemical reaction of gases. Such a deposition process is referred to as chemical vapor deposition or "CVD". Conventional thermal CVD processes supply reactive gases to the substrate surface where heat-induced chemical reactions take place to produce a desired film.

Semiconductor device geometries have dramatically decreased in size since such devices were first introduced several decades ago. Today's wafer fabrication plants are routinely producing 0.5 and even 0.35 micron feature size devices, and tomorrow's plants soon will be producing devices having even smaller geometries.

As device sizes become smaller and integration density increases, issues that were not previously considered important by the industry are becoming of paramount concern. With the advent of multilevel metal technology in which three, four, or more layers of metal are formed on the semiconductors, one goal of semiconductor manufacturers is lowering the dielectric constant of insulating layers such as intermetal dielectric layers deposited by thermal CVD or plasma enhanced CVD (PECVD) methods. Low dielectric constant films are particularly desirable for intermetal dielectric (IMD) layers to reduce the RC time delay of the interconnect metallization, to prevent cross talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer to form an oxide/halogen network. An example of halogen incorporation is described in U.S. patent application Ser. No. 08/344,283, commonly assigned to Applied Materials, Inc., filed on Nov. 24, 1994. Fluorine, the preferred halogen dopant for silicon oxide films, lowers the dielectric constant of the silicon oxide film because fluorine is an electronegative atom that decreases the polarizability of the overall Si—O—F network. Fluorine-doped silicon oxide films are also referred to as fluorosilicate glass films or FSG for short.

In addition to decreasing the dielectric constant, incorporating fluorine in intermetal silicon oxide layers also helps solve common problems encountered in fabricating smaller geometry devices, such as filling closely spaced gaps on semiconductor structures. It is believed that because fluorine is an etching species, fluorine doping introduces a deposition/etch/deposition effect on oxide formation. The deposition/etch/deposition effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. A variety of different precursor gases and liquids have been employed as the source of fluorine in the formation of these FSG films. Some of these precursors include $NF_3$, HF, $SF_6$, $CF_4$, $C_2F_6$, $C_2Cl_3F_3$ and triethoxyfluorosilane (TEFS) among others.

$SiF_4$ has been used in conjunction with some of the fluorine sources listed above to form FSG films. In such processes, however, $SiF_4$ has been employed as a silicon source and a second gas, e.g., $NF_3$, HF, $SF_6$, $CF_4$, $C_2F_6$, $C_2Cl_3F_3$, $SF_6$ or $F_2$, has been used as a source of fluorine. $SiF_4$ has not been used as the only source of fluorine for the formation of FSG films in combination with a silicon-containing source such as an organic silicon source like tetraethylorthosilane (TEOS).

SUMMARY OF THE INVENTION

Oxide layers are typically formed by plasma-enhanced or thermal processes. A plasma-enhanced process is described by the formula:

$$TEOS + O_2 \xrightarrow{(plasma)} SiO_2.$$

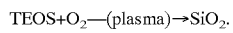

The oxide layer resulting from the plasma process forms voids over substrates having small geometries and high-aspect ratios and is therefore not suitable for forming intermetallic layers over such substrates.

On the other hand, a thermal process is described by the formula:

$$TEOS + O_3 \xrightarrow{(heat)} SiO_2 + H_2O.$$

The use of ozone allows the thermal process to proceed at about the same temperature as the plasma process, i.e., at about 400° C. Additionally, the thermal process provides very good gap filling properties for a 0.25 micron geometry with a 3:1 aspect ratio.

If, during the above-described thermal process, fluorine is introduced by, for example, a fluorine-containing compound such as $SiF_4$, the fluorine interacts with the $H_2O$ to form HF. While the rate of oxide deposition for the above-described TEOS thermal CVD process is about 1500 Angstroms/min, the introduction of $SiF_4$ reduces the deposition rate to less than 100 Angstroms/min. It is believed that the HF formed during the fluorine reaction etches part of the film to reduce the deposition rate.

If $SiF_4$ is reacted directly with ozone in a thermal process, no film is deposited because the thermal energy is not sufficient to overcome the threshold energy of the reaction.

In the present invention, $SiF_4$ is processed in a discharge tube remote from the CVD chamber to dissociate the $SiF_4$ into dissociated $SiF_4$ radicals such as SiF* and $SiF_2$*. These radicals are then introduced into the chamber along with ozone ($O_3$) to form an Si—O—F film which is expected to have gap-filling characteristics consistent with the thermal processes described above. In contrast to the above-described process where $SiF_4$ and ozone failed to react, the dissociated $SiF_4$ radicals have a much lower reaction threshold, and it is expected that the dissociated $SiF_4$ radicals and ozone will react at a sufficiently high rate to form an oxide layer at a commercially acceptable deposition rate. Additionally, the presence of F in the film should result in a film having lower a dielectric constant and good gap-filling capability.

According to another aspect of the invention, oxygen($O_2$) is introduced into the chamber along with the $SiF_4$ radicals to form an Si—O—F film having the above-described desirable characteristics described above. It is expected that reaction will proceed at acceptable deposition rates for oxygen because of the high reactivity of the dissociated $SiF_4$ radicals.

Critical to the process is the dissociation of the $SiF_4$ remote from the process chamber. If the dissociation were performed in the chamber then a plasma would be formed, creating a sheath near the surface of the substrate. As is known in the art, the sheath field is perpendicular to the surface of the substrate and accelerates plasma electrons onto the surface of the substrate, thereby degrading the quality of the deposited film. Thus, by dissociating the $SiF_4$ remotely from the chamber, the surface degrading or damaging effects of an in situ plasma are avoided.

BRIEF DESCRIPTION OF THE DRAWINGS

FIGS. 1C and 1D are exploded perspective views of parts of the CVD chamber depicted in FIG. 1A;

FIG. 1E is a simplified diagram of system monitor and CVD system 10 in a multichamber system, which may include one or more chambers;

DETAILED DESCRIPTION OF THE PREFERRED EMBODIMENTS

I. Exemplary CVD Chamber

Figure 1A:
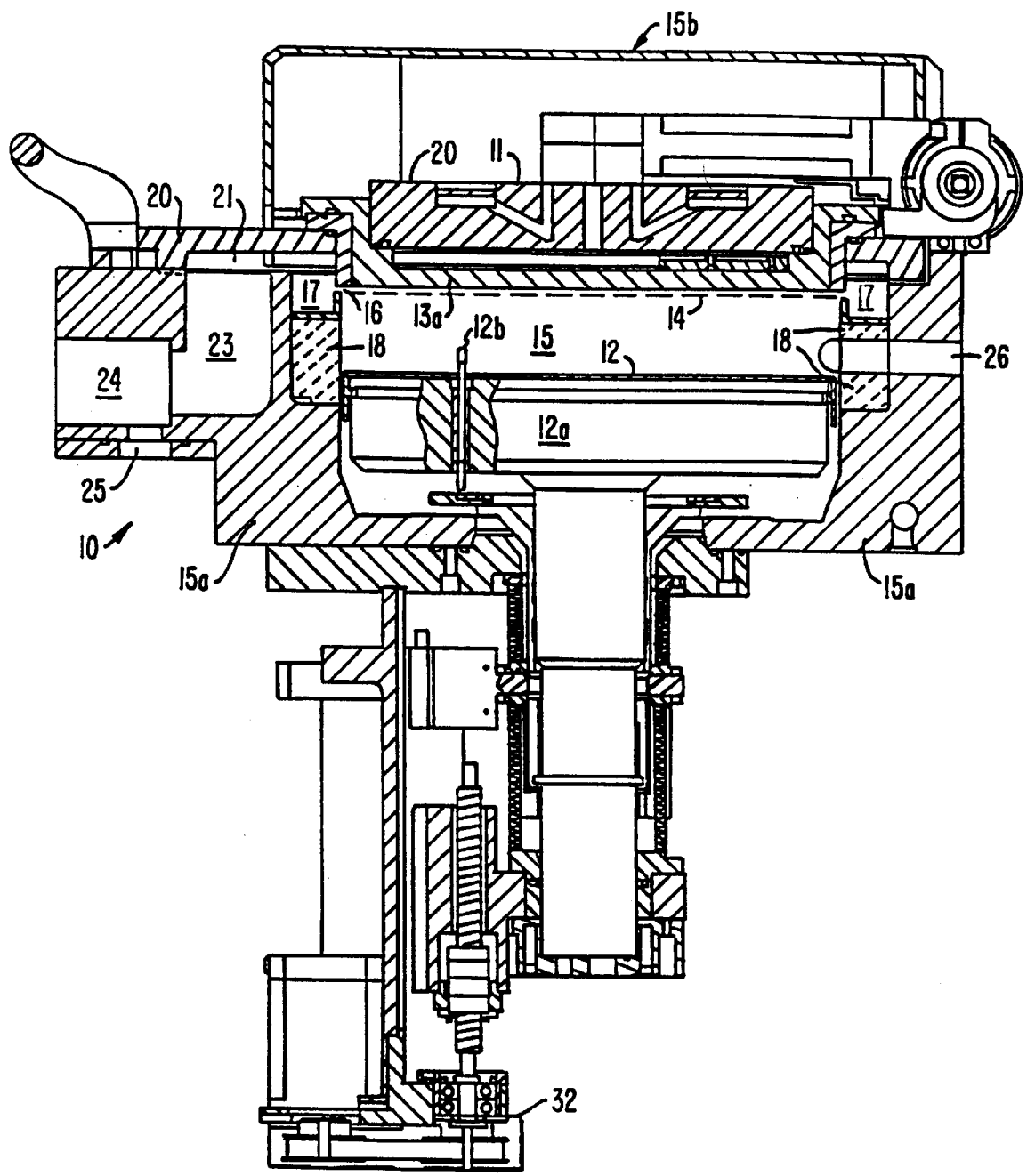
FIGS. 1A and 1B are vertical, cross-sectional views of one embodiment of a chemical vapor deposition apparatus according to the present invention.
Figure 1B:
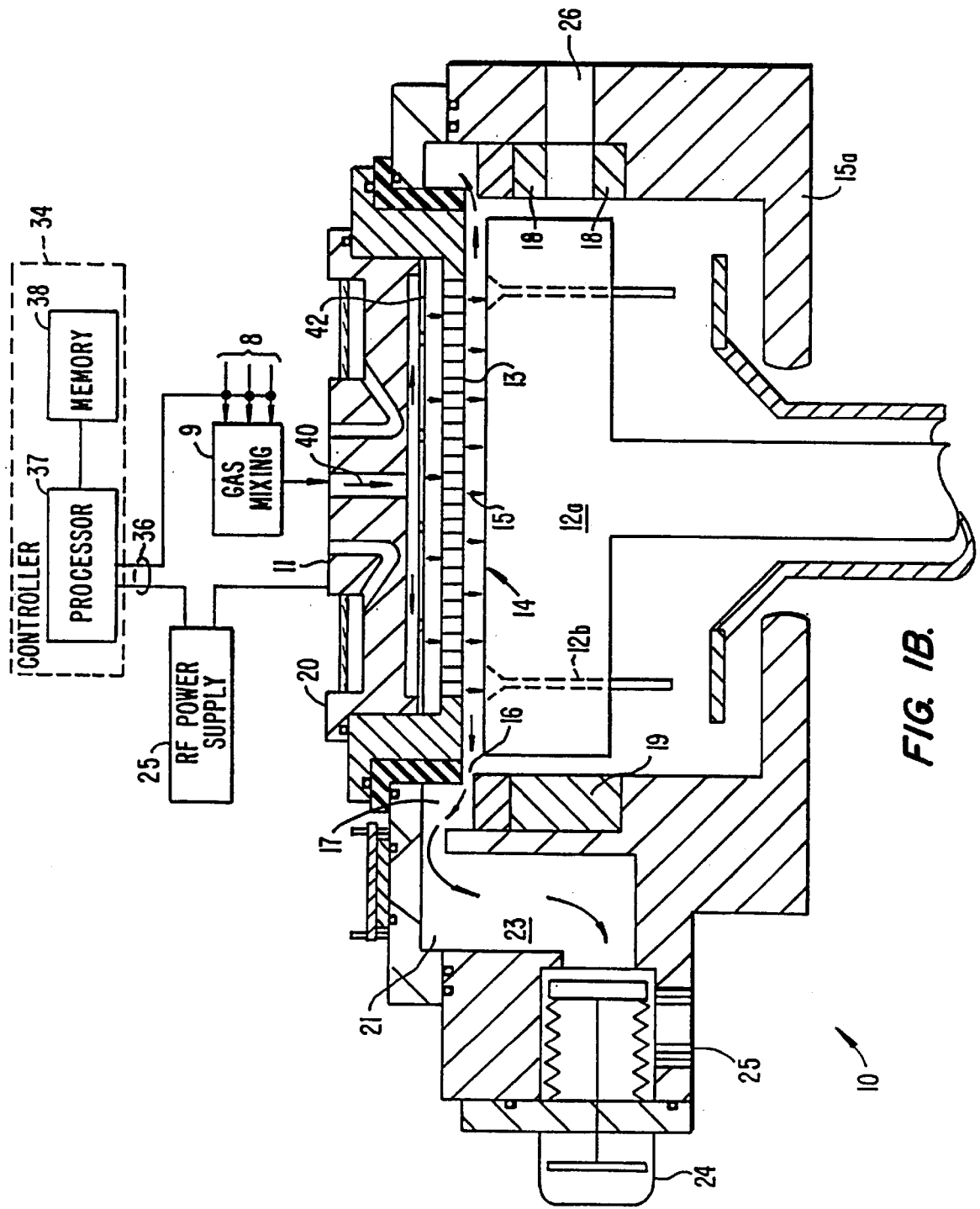
Figure 1C:
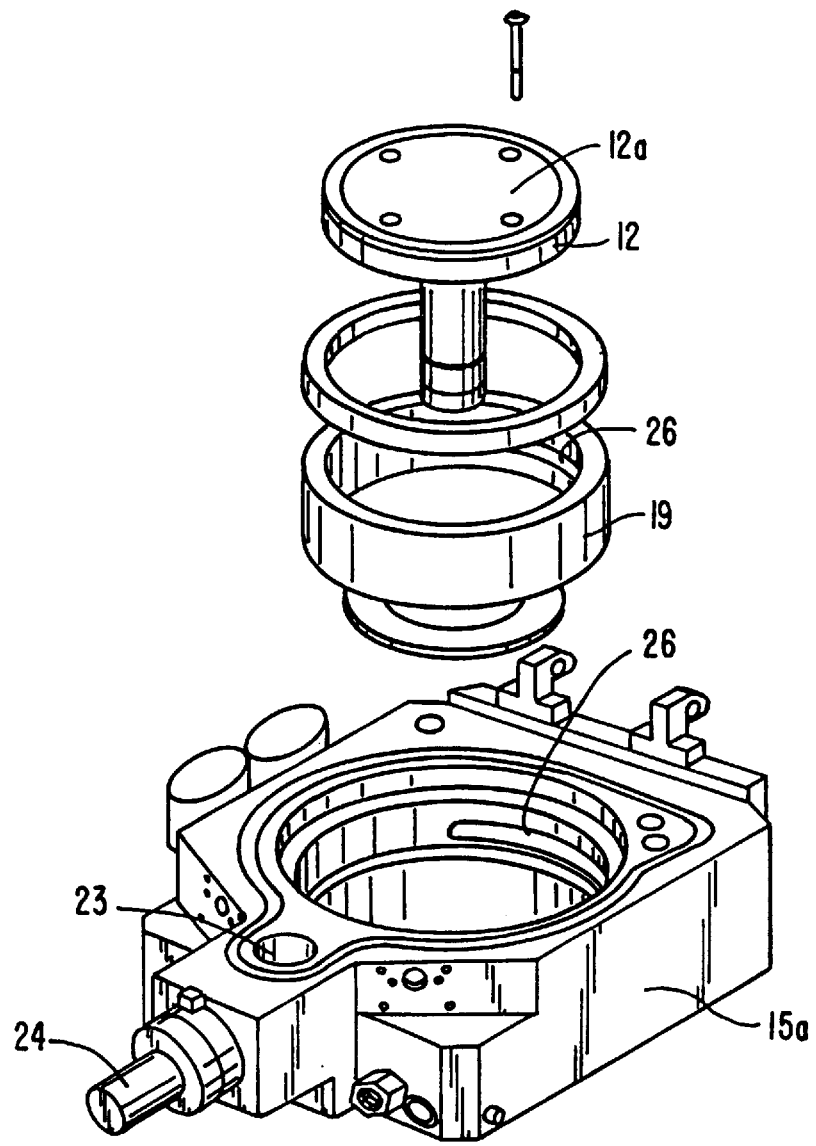

One suitable CVD machine in which the method of the present invention can be carried out is shown in FIGS. 1A and 1B, which are vertical, cross-sectional views of a chemical vapor deposition chamber 10, or processing chamber, having a vacuum chamber 15 including a chamber wall 15a and chamber lid assembly 15b. The chamber parts are shown in perspective in FIGS. 1C and 1D.

Processing chamber 10 contains a gas distribution manifold 11 for dispersing process gases through perforated holes in the manifold to a wafer (not shown) that rests on a platen 12. Generally, the process gases supply lines for each of the process gases include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, the several safety shut-off valves are positioned on each gas supply line in conventional configurations. Before reaching manifold 11, deposition and carrier gases are input through gas lines 8 into a mixing system 19 where they are combined and then sent to manifold 11.

A platen 12 in the form of a support face on a heated pedestal 12a centered within the process chamber 10 supports a semiconductor wafer or substrate (not shown) at the wafer processing location on the flat (or slightly convex), circular face of the pedestal 12a. The pedestal 12a can be controllably moved between a lower loading/off-loading position (depicted in FIG. 1A) and an upper processing position (indicated by dashed line 14 in FIG. 1 and shown in FIG. 1B) which is adjacent to manifold 11. A centerboard (not shown) includes sensors for providing information on the position of the wafers.

As stated above, during a deposition process the semiconductor wafer (not shown) is supported on the face of the pedestal 12a. The face is parallel and spaced closely to a process gas distribution faceplate 13a having holes 13b (see FIG. 1D) through which process gases enter the chamber. More specifically, deposition process gases flow into the chamber through the inlet manifold 11, and through the holes 13b in a conventional flat, circular gas distribution faceplate 13a.

The deposition process performed in processing chamber 10 is a thermal process the CVD reaction is driven by thermal energy supplied to the substrate to cause the processes to deposit a reaction product on the surface of the substrate. The remainder of the gas mixture that is not deposited in a layer, including reaction products, is evacuated from the chamber by a vacuum pump (not shown). Specifically, the gases are exhausted through an annular, slot-shaped orifice 16 surrounding enough of the reaction region and into an annular exhaust plenum 17. The annular slot 16 and the plenum 16 are defined by the gap between the top of the chamber's cylindrical side wall 18 (including the upper dielectric lining on the wall) and the bottom of the circular chamber lid 20. The 360° circular symmetry and uniformity of the slot orifice 16 and the plenum 17 are important for achieving a uniform flow of process gases over the wafer to deposit a uniform film on the wafer.

From the exhaust plenum 17, the gases flow underneath a lateral extension portion 21 of the exhaust plenum 17, past a viewing port 22, through a downward-extending gas passage 23, past a vacuum shut-off valve 24 (whose body is integrated with the lower chamber body 10a), and into the exhaust outlet which connects to the external vacuum pump (not shown).

The wafer support platen of the pedestal 12 (preferably aluminum) is heated using a double full-turn single-loop embedded heater element configured to form parallel concentric circles. An outer portion of the heater element runs adjacent to a perimeter of the support platen while an inner portion runs on the path of a concentric circle having a smaller radius. The wiring to the heater element passes through the stem of the pedestal 12a.

Typically, any or all of the chamber lining, gas inlet manifold faceplate, and various other chamber hardware are made out of material such as aluminum or anodized aluminum. An example of such a CVD apparatus is described in U.S. Pat. No. 5,558,717, filed Nov. 30, 1994, entitled "CVD Processing Chamber," issued to Zhao et al. and assigned to Applied Materials, Inc., the assignee of the present invention.

A lift mechanism and motor 32 raises and lowers the heated pedestal assembly 12a and its wafer lift pins 12b as wafers are transferred into and out of the body of the chamber by a robot blade (not shown) through an insertion/removal opening 26 in the side of the chamber 10. The motor 32 raises and lowers platen 12 between a processing position 14 and a lower, wafer-loading position. The heater, motors, valves or flow controllers connected to supply lines 8, gas delivery system, throttle valve 24, and substrate heating system are all controlled by a system controller 34 over control lines 36 of which only some are shown.

Motor 32 and gas mixing system 19 are controlled by a system controller 34 over control lines 36. The chamber includes analog assemblies such as mass flow controllers (MFCs), and heating unit that are controlled by the system controller 34 which executes system control software stored in a memory 38, which, in the preferred embodiment is a hard disk drive. Motors and optical sensors are used to move and determine the position of movable mechanical assemblies such as the throttle valve and platen.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, platen position, and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single-board computer (SBC) processor 37, analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

The interface between a user and processor 34 is via a CRT monitor 50a and lightpen 50b, shown in FIG. 1E, which is a simplified diagram of the system monitor and CVD system 10 in a multichamber system, which may include one or more chambers. In the preferred embodiment, two monitors 50a are used, one mounted in the clean room wall for the operators and the other behind the wall for the service technicians. Both monitors 50a simultaneously display the same information, but only one lightpen 50b is enabled. With a light sensor in the tip of the pen, the lightpen 50b detects light emitted by CRT display. To select a particular screen or function, the operator touches a designated area of the display screen and pushes the button on the pen 50b. The touched area changes its highlighted color, or a new menu or screen is displayed, confirming communication between the lightpen and the display screen. Other devices, such as a keyboard, mouse, or other pointing or communication device, may be used instead of or in addition to lightpen 50b to allow the user to communicate with processor 34.

The process for depositing the film can be implemented using a computer program product that is executed by processor 34. The computer program code can be written in any conventional computer-readable programming language, such as 68000 assembly language, C, C++, Pascal, Fortran. Suitable program code is entered into a single file or multiple files, using a conventional text editor, and is stored or embodied in a computer-usable medium, such as a memory system of the computer. If the entered code text is in a high level language, the code is compiled, and the resultant compiler code is then linked with an object code of precompiled window's library routines. To execute the linked compiled object code, the system user invokes the object code, causing the computer system to load the code in memory, from which the CPU reads and executes the code to perform the tasks identified in the program.

Figure 1F:
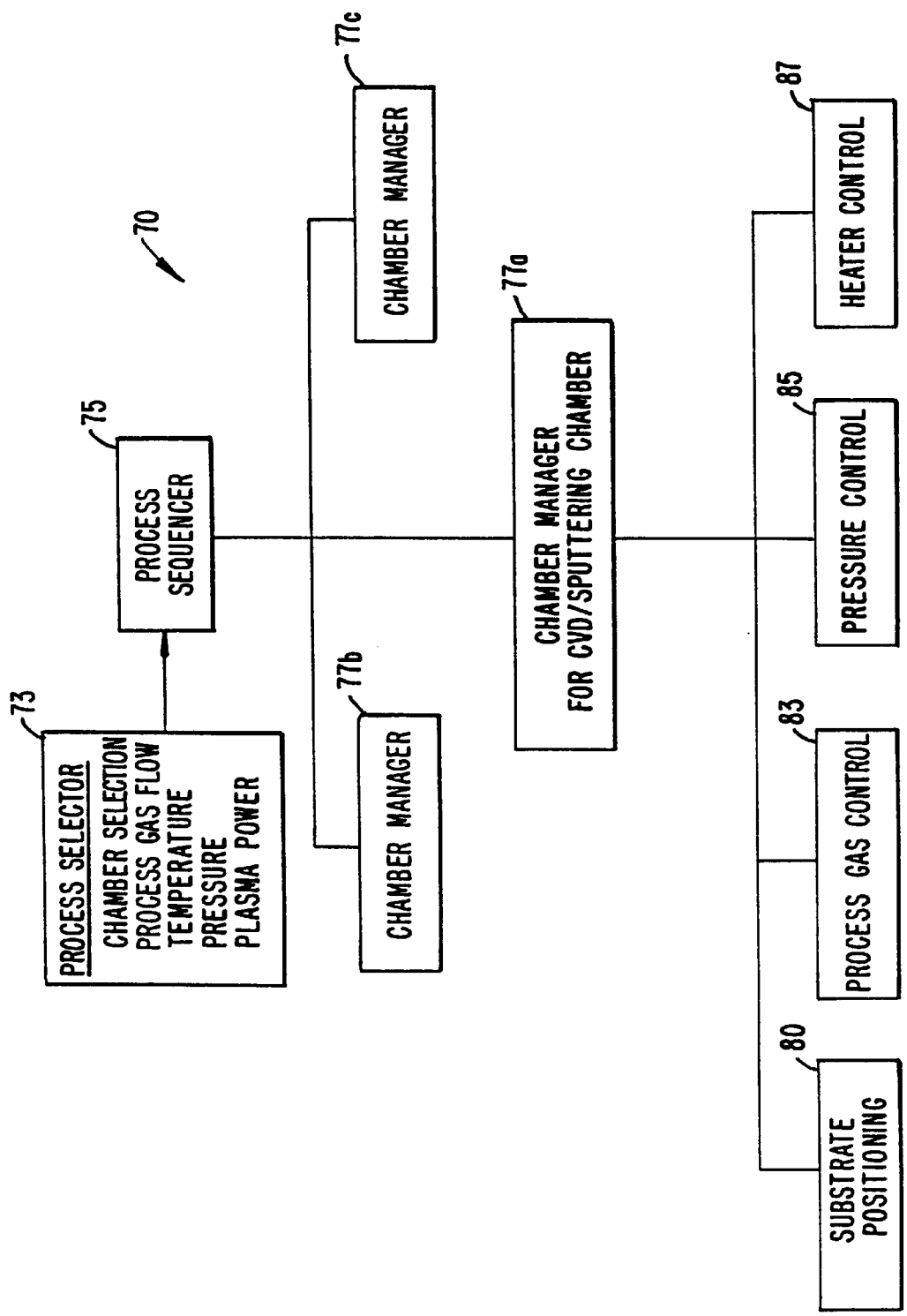
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. By using the lightpen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as process gas composition and flow rates, temperature, pressure, cooling gas pressure, and chamber wall temperature, and are provided to the user in the form of a recipe. The parameters specified by the process recipe are entered utilizing the lightpen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, the sequencer subroutine 75 takes into consideration the present condition of the process chamber being used in comparison with the desired process conditions for a selected process, or the "age" of each particular user-entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 10 according to the process set determined by the sequencer subroutine 75. For example, the chamber manager subroutine 77a comprises program code for controlling sputtering and CVD process operations in the process chamber 10. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, and heater control subroutine 87. Those having ordinary skill in the art would readily recognize that other chamber control subroutines can be included depending on what processes are desired to be performed in the process chamber 10. In operation, the chamber manager subroutine 77a selectively schedules or calls the process component subroutines in accordance with the particular process set being executed. The chamber manager subroutine 77a schedules the process component subroutines like the sequencer subroutine 75 schedules which process chamber 10 and process set are to be executed next. Typically, the chamber manager subroutine 77a includes steps of monitoring the various chamber components, determining which components needs to be operated, based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the platen 12, and optionally, to lift the substrate to a desired height in the vacuum chamber 15 to control the spacing between the substrate and the gas distribution manifold 11. When a substrate is loaded into the process chamber 10, the platen 12 is lowered to receive the substrate, and thereafter, the platen 12 is raised to the desired height in the chamber, to maintain the substrate at a first distance or spacing from the gas distribution manifold during the CVD process. In operation, the substrate positioning subroutine 80 controls movement of the platen in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is introduced into the vacuum chamber 15 to stabilize the pressure in the chamber before reactive process gases are introduced. For these processes, the process gas control subroutine 83 is programmed to include steps for flowing the inert gas into the vacuum chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the vacuum chamber 15 by regulating the size of the opening of the throttle valve in the exhaust system 115 of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 measures the pressure in the vacuum chamber 15 by reading one or more conventional pressure nanometers connected to the chamber, comparing the measured value(s) to the target pressure, obtaining PID (proportional, integral, and differential) values from a stored pressure table corresponding to the target pressure, and adjusting the throttle valve according to the PID values obtained from the pressure table. Alternatively, the pressure control subroutine 85 can be written to open or close the throttle valve to a particular aperture size to regulate the vacuum chamber 15 to the desired pressure.

The heater control subroutine 87 comprises program code for controlling the current to a heating unit that is used to heat the substrate. The heater control subroutine 87 is also invoked by the chamber manager subroutine 77a and receives a target, or setpoint, temperature parameter. The heater control subroutine 87 measures the temperature by measuring voltage output of a thermocouple located in a platen 12, comparing the measured temperature to the setpoint temperature, and increasing or decreasing current applied to the heating unit to obtain the setpoint temperature. The temperature is obtained from the measured voltage by looking up the corresponding temperature in a stored conversion table, or by calculating the temperature using a fourth-order polynomial. When an embedded loop is used to heat the platen 12, the heater control subroutine 87 gradually controls a ramp up/down of current applied to the loop. Additionally, a built-in fail-safe mode can be included to detect process safety compliance, and can shut down operation of the heating unit if the process chamber 10 is not properly set up.

The above chamber description is mainly for illustrative purposes, variations of the above-described system such as variations in platen design, and heater design. For example, the wafer could be supported and heated by quartz lamps. The layer and method for forming such a layer of the present invention is not limited to any specific apparatus.

II. Deposition of Si—O—F Film Using Ozone or Oxygen and Remotely Disassociated $SiF_4$ Radicals.

Figure 2A:
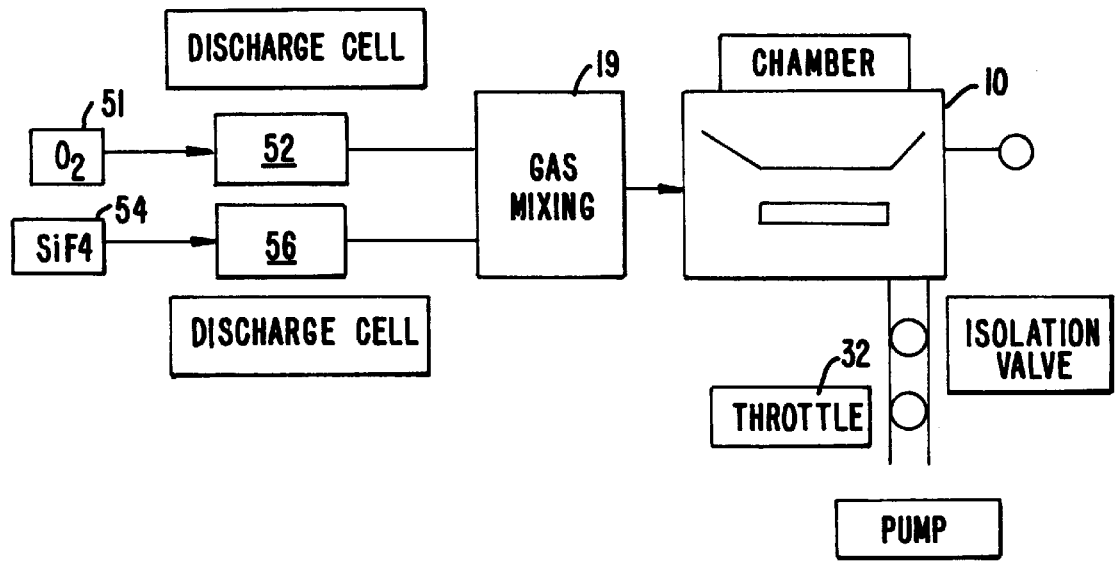
FIGS. 2A and B are block diagrams of preferred embodiments of the invention.

FIG. 2A is a block diagram of a preferred embodiment of the invention. In FIG. 2A, a source 51 of oxygen ($O_2$) is connected to an ozonator discharge cell 52 and a source 54 of silicon tetrafluoride ($SiF_4$) is connected to a dissociation discharge cell 56. The output from the discharge cells are coupled to the inputs of the gas mixing chamber 19 to be provided to the vacuum chamber as described above.

Figure 2B:
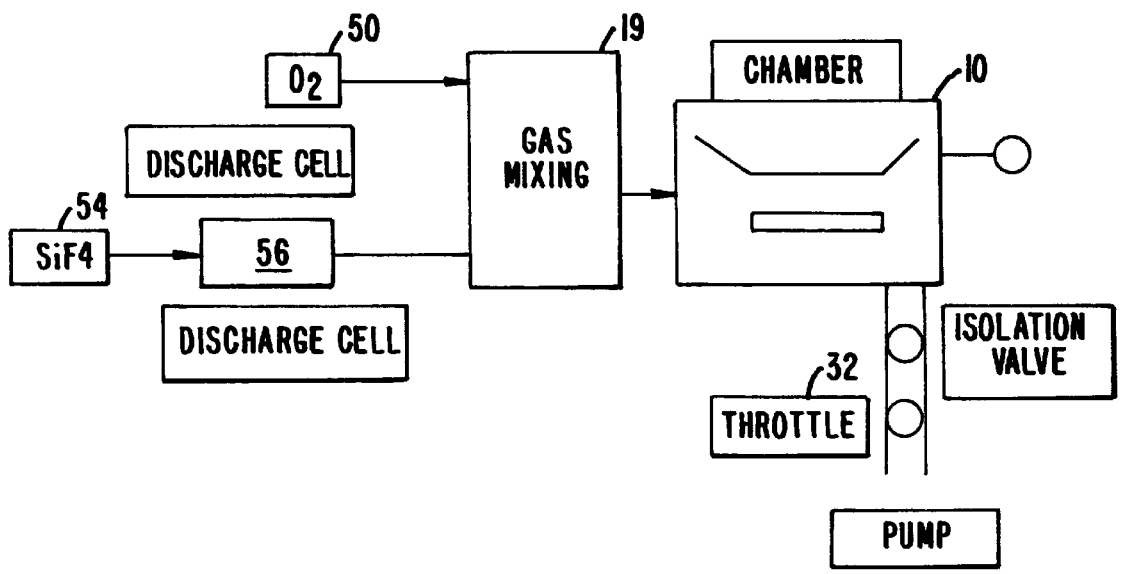

A system for providing oxygen directly to the gas mixing chamber is depicted in FIG. 2B. The only difference from the system in FIG. 2A is that the oxygen source 51 is coupled directly to the gas mixing chamber 19.

Figure 3:
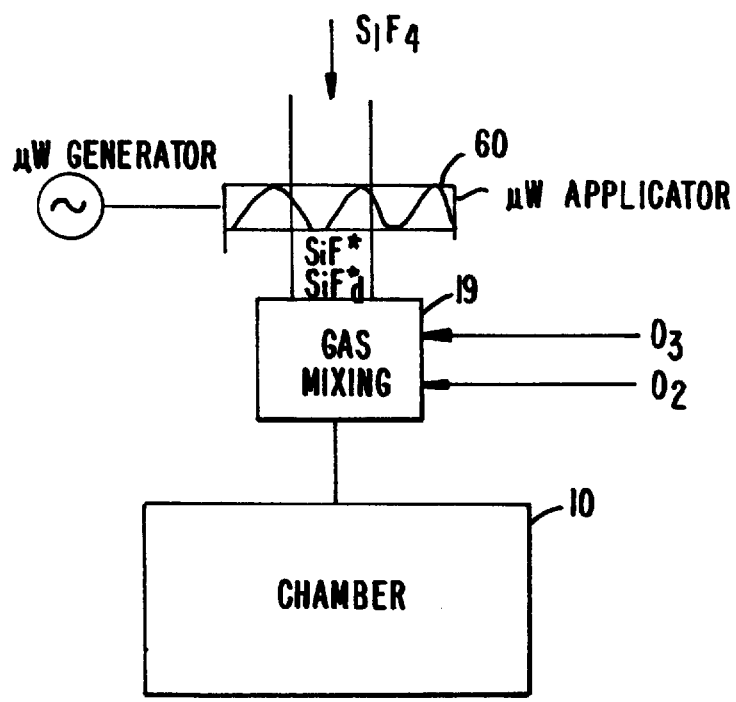
FIGS. 3 and 4 depict particular configurations of the discharge cells for utilization in preferred embodiments.
Figure 4:
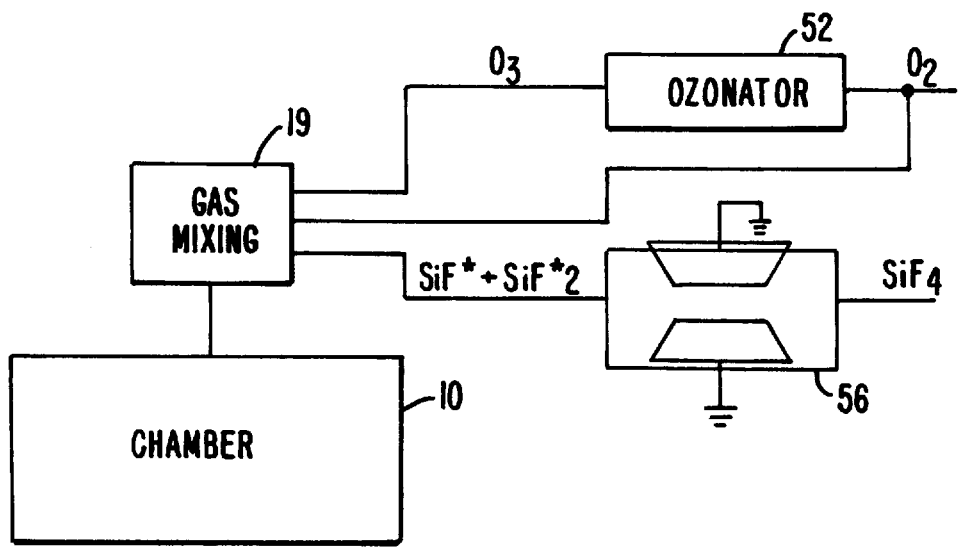

FIGS. 3 and 4 depict particular configurations of the discharge cells for utilization in preferred embodiments. In FIG. 3, the SiF₄ is passed through a commercially available microwave applicator 60, such as model 7610 manufactured by Applied Science and Technology (ASTeX) of Woburn, Mass., which dissociates the SiF₄ into radicals. The dissociated radicals are mixed with ozone or oxygen in the gas mixing chamber 19 and provided to the process chamber 10. In FIG. 4 the SiF₄ is passed through a parallel plate chamber 56 which is of similar construction to the commercially available ozonator 52, such as the model 8200 manufactured by ASTeX.

Figure 5A:
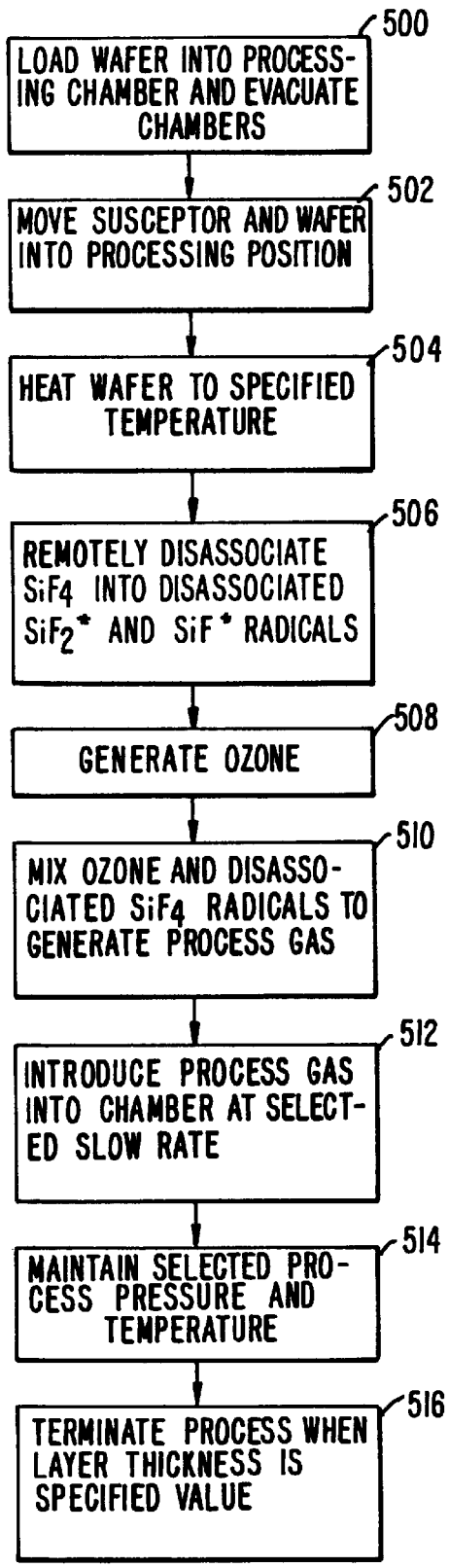
FIGS. 5A and B are flow charts illustrating process steps in the formation of a Si—O—F film according to embodiments of the method of the present invention.

FIG. 5A is a flow chart setting forth the steps forming the Si—O—F film utilizing ozone as an oxygen source. A typical use of the film would be as an intermetal dielectric layer deposited over a metallization layer. Thus, a suitable wafer is loaded 500 into the chamber and placed on the platen, and the chamber is evacuated to a specified process pressure. The platen and wafer are moved 502 into processing position and heated 504 to a specified temperature. SiF₄ is then remotely dissociated 506 into dissociated SiF₃* and SiF* radicals, ozone is generated 508, and the dissociated radicals and ozone are mixed 510 to form a process gas. The process gas is introduced 512 into the chamber at a selected flow rate and the chamber is maintained 514 at a selected process temperature and pressure for the duration of the process. The process is terminated 516 when the deposited Si—O—F film is a specified thickness.

Figure 5B:
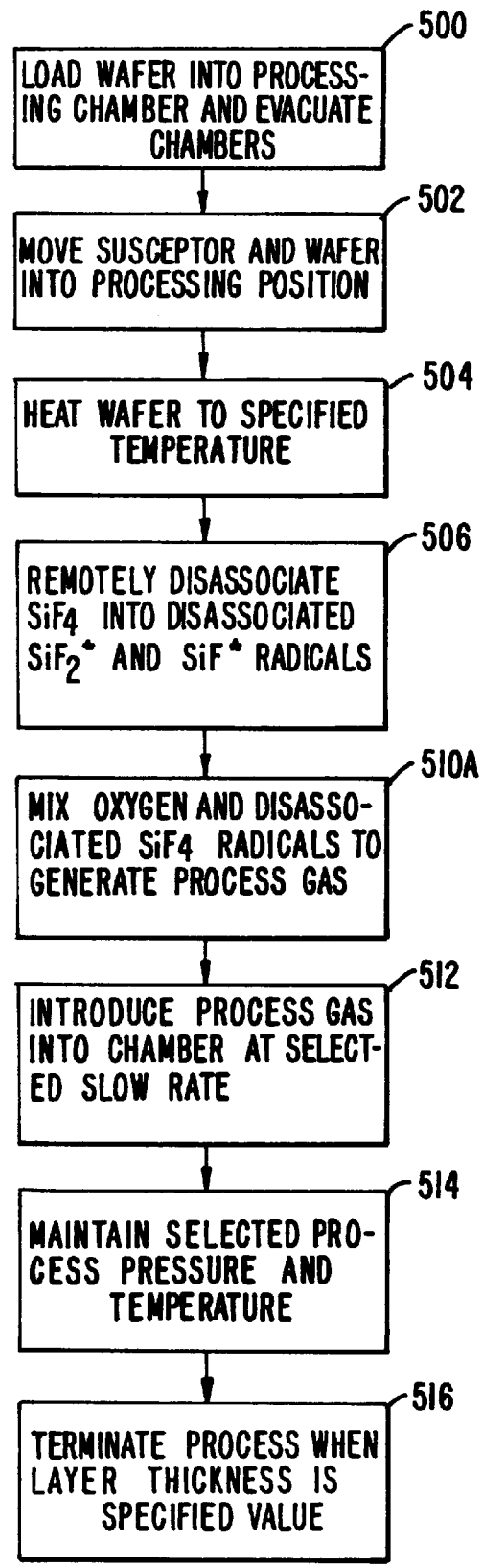

Alternatively, FIG. 5B, depicts a similar process utilizing molecular oxygen as the oxygen source. The ozone generating step 508 is omitted and oxygen is reacted with the SiF₄ radicals to form an Si—O—F film having a low dielectric constant.

Suitable process temperatures are in a range of 400°–500° C. and suitable process pressures are in the range of about 1 to 700 torr. The deposition rate will be controlled by the SiF₄ flow rate, which is an order of magnitude greater than the flow rate of the dissociated SiF₄ radicals. The process flow rate for ozone or oxygen is in the range of about 4,000 to 5,000 sccm, and the process flow rate of dissociated SiF₄ radicals is in the range of about 100 to 300 sccm. Thus, the ratio of the flow rate of dissociated SiF₄ radicals to the flow rate of ozone/oxygen is between 1:50 and 3:40. The high-pressure process is expected to give good gap-fill characteristics and low-moisture Si—O—F films.

The particular flow rates and pressures described above relate to performing the process of the invention in the chamber depicted in FIG. 1 for wafers 8 inches in diameter. Persons of skill in the art, apprised of the disclosure herein, may modify the process parameters to perform the process in vacuum chambers of different design. Accordingly, the above-described examples do not limit the invention.

III. Exemplary Structure

Figure 6:
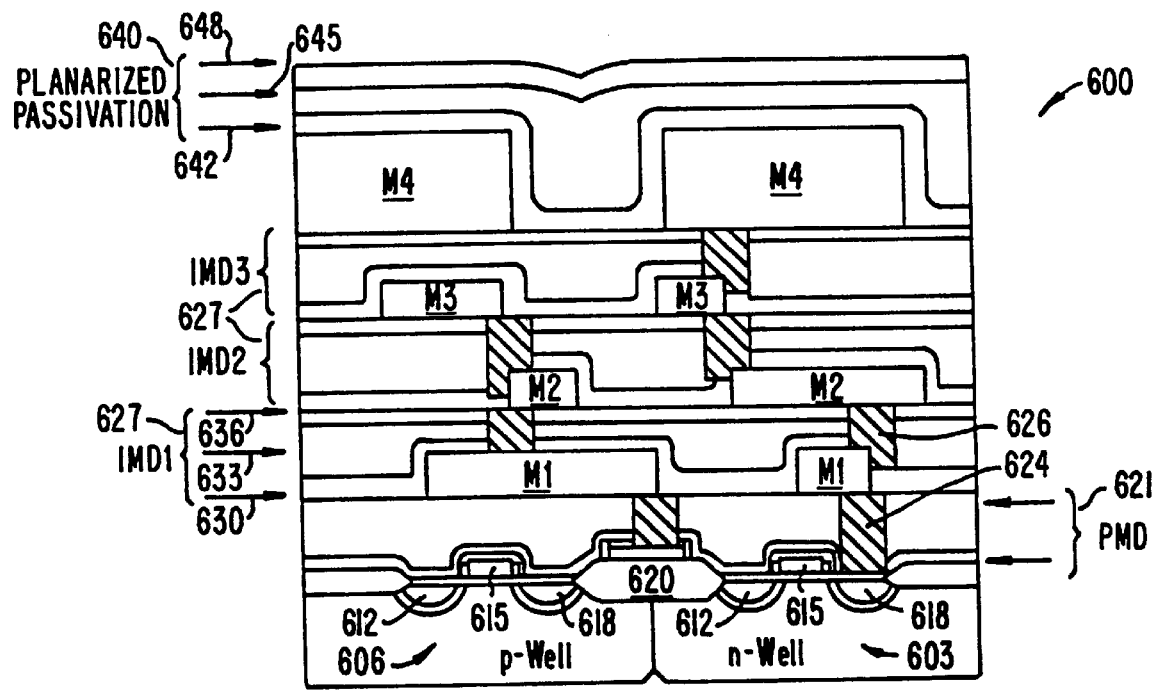
FIG. 6 is a simplified cross-sectional view of a semiconductor device manufactured according to the method of the present invention.

FIG. 6 illustrates a simplified cross-sectional view of an integrated circuit 600 according to the present invention. As shown in FIG. 2, integrated circuit 600 includes NMOS and PMOS transistors 603 and 606, which are separated and electrically isolated from each other by a field oxide region 620. Each transistor 603 and 606 comprises a source region 612, a gate region 615 and a drain region 618.

A premetal dielectric layer 621 separates transistors 603 and 606 from metal layer M1 with connections between metal layer M1 and the transistors made by contacts 624. Metal layer M1 is one of four metal layers, M1–M4, included in integrated circuit 600. Each metal layer M1–M4 is separated from adjacent metal layers by respective intermetal dielectric layers 627 (IMD1, IMD2 and IMD3). IMD layers 627 may include a PECVD lining layer 630, an SACVD gap fill layer 633 and a cap layer 636. Adjacent metal layers are connected at selected openings by vias 626. Deposited over metal layer M4 are planarized passivation layers 640. Similar to IMD layers 627, passivation layer 640 may include a lining layer 642, a gap fill layer 645, and a cap layer 648.

The layer of the present invention may find uses in each of the dielectric layers shown in integrated circuit 600. The layer of the present invention may also be used in damascene layers which are included in some integrated circuits. In damascene layers, a blanket layer is deposited over a substrate, selectively etched through to the substrate and then filled with metal and etched back or polished to form metal contacts such as M1. After the metal layer is deposited, a second blanket deposition is performed and selectively etched. The etched areas are then filled with metal and etched back or polished to form vias 626.

It should be understood that the simplified integrated circuit 600 is for illustrative purposes only. One of ordinary skill in the art could implement the present method for fabrication of other integrated circuits such as microprocessors, application-specific integrated circuits (ASICS), memory devices, and the like.

What is claimed is:

1. A process for depositing an Si—O—F insulating layer on a substrate in a CVD processing chamber, said process comprising the steps of:

evacuating the chamber to establish a selected processing pressure;

heating said substrate to a selected processing temperature;

introducing a process gas comprising a selected amount of an oxygen-containing source gas and remotely dissociated SiF₄ radicals into said chamber; and maintaining said chamber at process conditions sufficient to deposit said SiOF insulating layer over said substrate.

2. The process of claim 1 wherein a gas flow ratio of a flow rate of said remotely dissociated SiF₄ radicals introduced into said chamber to a flow-rate of said oxygen-containing source gas introduced into said chamber is between about 1:50 to 3:40.

3. The process of claim 1 wherein said oxygen-containing source gas comprises oxygen (O₂) or ozone (O₃).

4. The process of claim 3 with the step of heating said substrate further comprising the step of heating the substrate to a temperature of between about 400°–500° C.

5. The process of claim 3 further with the step of evacuating the chamber further comprising the step of evacuating the chamber to a pressure of between about 1 to 700 torr.

6. The process of claim 3 wherein said oxygen-containing source gas is introduced into said chamber at a rate of between about 4,000 to 5,000 sccm and wherein said remotely dissociated SiF₄ radicals are introduced into said chamber at a rate of between about 100–300 sccm.

7. A process for depositing an Si—O—F insulating layer on a substrate in a CVD chamber, said process comprising the steps of:

(a) heating said substrate to a temperature of between about 350°–500° C.;

(b) introducing a process gas comprising an oxygen-containing source in the form of ozone and a gas containing dissociated SiF₄ radicals into said chamber;

(c) maintaining said chamber at a pressure of between about 1 to 700 torr; and (d) thermally reacting said process gas to deposit said Si—O—F insulating layer on said substrate.

8. A process for depositing an Si—O—F insulating layer on a substrate in a CVD chamber, said process comprising the steps of:
   (a) heating said substrate to a temperature of between about 350°–500° C.;
   (b) introducing a process gas comprising an oxygen-containing source gas of oxygen and a gas containing remotely dissociated $SiF_4$ radicals into said chamber;
   (c) maintaining said chamber at a pressure of between about 1 to 700 torr; and
   (d) thermally reacting said process gas to deposit said Si—O—F insulating layer on said substrate.

9. The process of claims 7 or 8 wherein a gas flow ratio of a flow rate of said remotely dissociated $SiF_4$ radicals introduced into said chamber to a flow-rate of said oxygen-containing source gas introduced into said chamber is between about 1:50 to 3:40.

10. The process of claims 7 or 8 wherein said deposited Si—O—F film is characterized by having a dielectric constant of less than about 3.6.

11. The process of claim 1, wherein said process gas consists essentially of said oxygen containing source gas and said remotely dissociated $SiF_4$ radicals.

* * * * *